(12) United States Patent
Dai et al.

(10) Patent No.: US 9,847,382 B2
(45) Date of Patent: Dec. 19, 2017

(54) ARRAY SUBSTRATE, MANUFACTURING METHOD THEREOF, AND DISPLAY DEVICE

(71) Applicant: BOE TECHNOLOGY GROUP CO., LTD., Beijing (CN)

(72) Inventors: Qing Dai, Beijing (CN); Ze Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/362,117

(22) PCT Filed: Dec. 16, 2013

(86) PCT No.: PCT/CN2013/089498
§ 371 (c)(1),
(2) Date: May 30, 2014

(87) PCT Pub. No.: WO2015/021714
PCT Pub. Date: Feb. 19, 2015

(65) Prior Publication Data
US 2015/0303242 A1 Oct. 22, 2015

(30) Foreign Application Priority Data

Aug. 13, 2013 (CN) .......................... 2013 1 0351782

(51) Int. Cl.
*H01L 27/32* (2006.01)
*H01L 51/52* (2006.01)
*H01L 51/56* (2006.01)

(52) U.S. Cl.
CPC ...... *H01L 27/3258* (2013.01); *H01L 27/3248* (2013.01); *H01L 51/5215* (2013.01);
(Continued)

(58) Field of Classification Search
CPC ...... H01L 33/44; H01L 21/02; H01L 27/3258
See application file for complete search history.

(56) References Cited

U.S. PATENT DOCUMENTS

2008/0283859 A1* 11/2008 Chen ...................... H01L 33/44
257/98
2009/0109435 A1* 4/2009 Kahen .................. C09K 11/025
356/317
(Continued)

FOREIGN PATENT DOCUMENTS

CN 1829399 A 9/2006
CN 101800241 A 8/2010
(Continued)

OTHER PUBLICATIONS

PCT Notification of Transmittal of the International Search Report and the Written Opinion of the International Searching Authority, or the Declaration for Counterpart PCT Application No. PCT/CN2013/089498, 14 pgs., (dated May 19, 2014).
(Continued)

*Primary Examiner* — Thao X Le
*Assistant Examiner* — Geoffrey Ida
(74) *Attorney, Agent, or Firm* — Blakely, Sokoloff, Taylor & Zafman LLP

(57) ABSTRACT

The present invention provides an array substrate, a manufacturing method thereof, and a display device, belonging to the field of organic electroluminescence display technology, which may solve the problem of low light extraction efficiency of existing array substrates. The array substrate of the present invention comprises an organic light emitting device and a planarization layer disposed therebelow, the OLED comprises: a first electrode layer, a second electrode layer, and a light-emitting layer disposed between the first electrode layer and the second electrode layer, the first electrode layer is a transparent electrode layer and disposed on the planarization layer, and the planarization layer is doped with metal micro/nanoparticles.

7 Claims, 2 Drawing Sheets

(52) U.S. Cl.
CPC ...... *H01L 51/5234* (2013.01); *H01L 51/5268* (2013.01); *H01L 51/56* (2013.01); *H01L 2227/323* (2013.01); *H01L 2251/301* (2013.01); *H01L 2251/308* (2013.01); *H01L 2251/5369* (2013.01)

(56) References Cited

U.S. PATENT DOCUMENTS

| | | | |
|---|---|---|---|
| 2009/0236977 A1* | 9/2009 | Suh | B82Y 20/00 313/504 |
| 2010/0150513 A1* | 6/2010 | Zhang | B82Y 20/00 385/131 |

FOREIGN PATENT DOCUMENTS

| | | |
|---|---|---|
| CN | 102272973 A | 12/2011 |
| CN | 103441138 A | 12/2013 |
| JP | 2006-100042 A | 4/2006 |
| JP | 2007-335253 A | 12/2007 |
| WO | WO 2011/065358 A1 | 6/2011 |

OTHER PUBLICATIONS

First Office Action for corresponding Chinese Patent Application No. 201310351782.9, 17 pp. (including English translation), (dated May 28, 2015).

PCT International Search Report for counterpart PCT Application No. PCT/CN2013/089498, 2 pp. (English translation only), (dated May 19, 2014).

PCT Written Opinion of the International Searching Authority for counterpart PCT Application No. PCT/CN2013/089498, 7 pp. (English translation only), (dated May 19, 2014).

* cited by examiner

ARRAY SUBSTRATE, MANUFACTURING METHOD THEREOF, AND DISPLAY DEVICE

CROSS-REFERENCE TO RELATED APPLICATIONS

This patent application is a U.S. National Phase Application under 35 U.S.C. §371 of International Application No. PCT/CN2013/089498, filed Dec. 16, 2013, entitled ARRAY SUBSTRATE, MANUFACTURING METHOD THEREOF, AND DISPLAY DEVICE, which claims priority to Chinese Patent Application No. 201310351782.9, filed Aug. 13, 2013.

FIELD OF THE INVENTION

The present invention relates to the field of organic electroluminescence display technology, and more particularly, to an array substrate, a manufacturing method thereof, and a display device.

BACKGROUND OF THE INVENTION

An organic electroluminescence device (OLED) has a basic structure including an anode layer, a cathode layer, and a light-emitting layer, which is one or more organic layer, sandwiched between the anode layer and the cathode layer. Upon application of a voltage, electrons and holes are injected into the organic layer from the anode and the cathode, respectively, and then the electrons and holes migrate in the light-emitting layer until they meet and recombine to generate excitons whose energy decays in the form of light, and thus light radiates.

An OLED generally includes a first electrode layer (i.e., an anode layer or a cathode layer), a second electrode layer (i.e., a cathode layer or an anode layer), and a light-emitting layer disposed between the first and second electrode layers; a planarization layer and a TFT (Thin Film Transistor) are disposed on a light-exiting side of the first electrode layer. Here, an OLED in which light is emitted from a side, which faces the planarization layer, of the first electrode is a bottom emission OLED, and the first electrode should be a transparent (such as ITO, i.e., Indium Tin Oxide) electrode layer, while the second electrode layer is generally an opaque electrode layer. Considering the structure of a bottom emission OLED, the bottom emission OLED generally has a relatively low aperture ratio, because some light is blocked by TFTs. To achieve a practically usable luminance, a voltage may be improved to increase the luminance of the bottom emission OLED, which, however, has a negative effect on the service life of the device and the material. Therefore, for a bottom emission OLED, demands on its performance indexes, such as service life of its material, light-extraction efficiency and the like, are higher.

In addition, energy loss occurs during the light-emitting process of an OLED, which is mainly reflected in the following two aspects.

Firstly, when injected carriers recombine to emit light in the light-emitting layer, not all injected energy is converted into photons, and part of exciton energy is consumed in non-radiative transition processes such as lattice vibrations, deep level impurity transitions and the like, and this phenomenon may be described by using inner quantum efficiency.

Secondly, due to total reflection occurring at the interfaces between the anode layer and the substrate, between the substrate and the air, and the like of the OLED, guided waves occurring at the interface of the anode layer and the light-emitting layer of the OLED, and surface plasmon loss near the metal electrode, after the light emitted from the light-emitting layer passes through the above multi-layer structure, only about 20% of the light emitted from the OLED can be emitted into the air, while about 80% of the light is consumed, and this phenomenon may be described by using outer quantum efficiency, which represents the efficiency of extracting light from the OLED, i.e., light extraction efficiency.

At present, an OLED with an inner quantum efficiency of nearly 100% can be realized in theory by improving performance of materials; however, kind of such materials is very limited. On the other hand, light extraction efficiency of an OLED may be greatly improved by using various techniques, for example, a technique of forming a surface microstructure on the transparent electrode layer to reduce the loss caused by guided wave, a technique of attaching photonic crystals or a microlens array to a glass substrate to reduce the total internal reflection, a technique of manufacturing a corrugated cathode to reduce its surface plasmon loss, and a technique of using an optical microcavity structure. However, in techniques of using photonic crystals, a periodic or quasi-periodic microstructure formed on the cathode, and the like, a nano photocopy technique is generally adopted, which has a complicated manufacturing process. Also, microcavity effect is likely to result in chromatic aberration, narrower viewing angle, and other drawbacks.

SUMMARY OF THE INVENTION

In view of the above disadvantages existing in existing OLEDs, an objectives of the present invention is to provide an array substrate, a manufacturing method thereof, and a display device, which may improve light extraction efficiency of an OLED.

To achieve the above objective, the present invention provides an array substrate, comprising an OLED and a planarization layer disposed therebelow, the OLED comprises: a first electrode layer, a second electrode layer, and a light-emitting layer disposed between the first electrode layer and the second electrode layer, the first electrode layer is a transparent electrode layer and disposed on the planarization layer, and the planarization layer is doped with metal micro/nanoparticles.

The planarization layer of the array substrate of the present invention is doped with metal micro/nanoparticles, and therefore the light extraction efficiency of the OLED is improved, which in turn improves the light extraction efficiency of the array substrate.

Preferably, a material of the metal micro/nanoparticles is any one or any combination of gold, silver and aluminum.

Preferably, the metal micro/nanoparticles have a shape of any one of sphere, prism, cube, cage, and core-shell structure.

Preferably, the metal micro/nanoparticles have particle diameters between 1 nm and 100 nm.

Preferably, the metal micro/nanoparticles have particle diameters of various sizes.

Preferably, a mass concentration of the metal micro/nanoparticles in the planarization layer is no less than 1% and no larger than 5%.

Preferably, a material of the first electrode layer is any one of indium tin oxide, zinc oxide and indium gallium zinc oxide, and/or, a material of the second electrode layer is any one of silver, copper and aluminum.

Further preferably, the above-described array substrate further comprises a TFT, which is covered by the planarization layer, and a drain of the TFT is connected to the first electrode layer of the OLED through a contact via passing through the planarization layer.

Preferably, the second electrode layer is a reflective layer.

A technical solution used to solve the technical problem of the present invention is to provide a display device, which comprises the above-described array substrate.

As the display device of the present invention includes the above-described array substrate, its light extraction efficiency is remarkably improved.

A technical solution used to solve the technical problem of the present invention is to provide a manufacturing method of an array substrate, which comprises the steps of:

S1: forming a TFT on a substrate through a patterning process;

S2: forming a planarization layer doped with metal micro/nanoparticles on the substrate formed with the TFT; and S3: forming a first electrode layer of an OLED on the planarization layer through a patterning process, wherein the first electrode layer is a transparent electrode layer.

In the manufacturing method of an array substrate, the planarization layer is doped with metal micro/nanoparticles, which greatly improves the light extraction efficiency of the OLED disposed on the planarization layer, and further improves the light extraction efficiency of the array substrate.

Preferably, the step of forming a planarization layer doped with metal micro/nanoparticles comprises:

S21: forming a first planarization layer on the substrate formed with the TFT;

S22: forming a non-continuous metal micro/nanoparticle layer on the first planarization layer; and S23: forming a second planarization layer on the metal micro/nanoparticles layer, thus obtaining the planarization layer doped with the metal micro/nanoparticles.

DESCRIPTION OF REFERENCE NUMERALS

101: substrate; 102: TFT; 103: planarization layer; 1031: first planarization layer; 1032: second planarization layer; 104: first electrode layer; 105: pixel-defining layer; 106: light-emitting layer; 107: second electrode layer; q: metal micro-nanoparticle; S1: light extraction efficiency curve of an OLED in an existing array substrate; S2: light extraction efficiency curve of an OLED in an array substrate provided by the present invention.

DETAILED DESCRIPTION OF EMBODIMENTS

For better understanding of the technical solutions of the present invention by the person skilled in the art, the present invention will be described in detail below in conjunction with the accompanying drawings and specific implementations.

Embodiment 1

Figure 3:
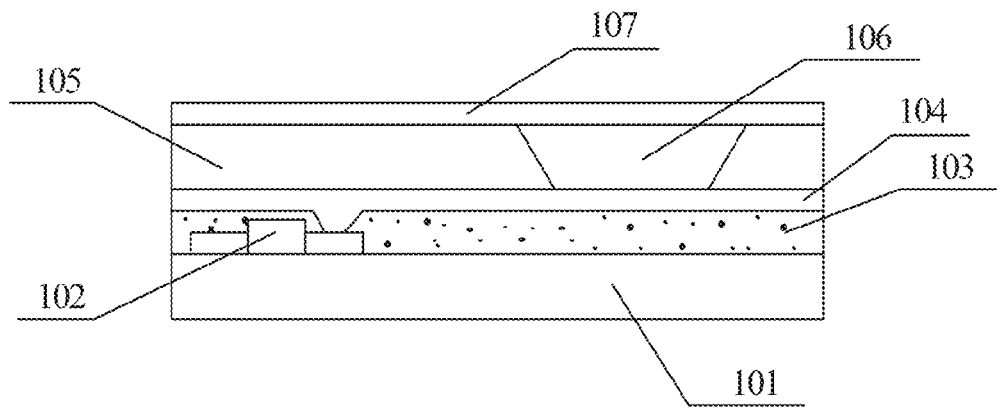
FIG. 3 is a schematic diagram illustrating a structure of an array substrate of Embodiment 1 of the present invention.

As shown in FIG. 3, this embodiment provides an array substrate, which comprises an OLED and a planarization layer 103 disposed therebelow, and the OLED comprises a first electrode layer 104, a second electrode layer 107, and a light-emitting layer 106 disposed between the first electrode layer 104 and the second electrode layer 107, wherein the first electrode layer 104 is a transparent electrode layer and disposed on the planarization layer 103, and the planarization layer 103 is doped with metal micro/nanoparticles q.

In the array substrate provided in this embodiment, since the planarization layer 103 disposed below the transparent electrode layer (i.e., the first electrode layer 104) in the OLED is doped with metal micro/nanoparticles q, the light exaction efficiency of the OLED is improved by using the surface plasmon resonance effect of the metal micro/nanoparticles q, and accordingly, the light exaction efficiency of the array substrate is improved.

Figure 1:
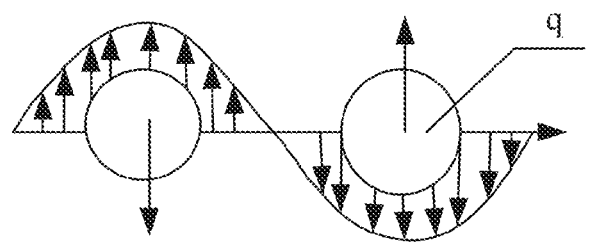
FIG. 1 is a schematic diagram illustrating surface plasmon resonance of a metal micro/nanoparticle in Embodiment 1 of the present invention.

It should be noted that, surface plasmons (SPs) refer to electron density waves propagating along a metal surface, which results from interaction of free-oscillating electrons and photons existing at the metal surface. The electron density wave is an electromagnetic surface wave, may laterally limit light wave in sub-wavelength scales, and has a flat dispersion curve and a large photonic density of states in the vicinity of its resonance frequency, and when interacting with an active medium, spontaneous radiation of the SPs may be enhanced. The SPs has the strongest field strength at a surface of a metal film, and its filed strength decays exponentially in a direction perpendicular to the interface, and the SPs can be excited both by electrons and by light waves. If the metal film has a very rough surface or a curved surface structure (e.g., sphere, cylinder, etc.), the SPs at its surface or around the curved surface structure cannot propagate along the interface in the form of wave, but is localized around the surface of these structures, i.e., the SPs is localized. When a metal micro/nanoparticle q with a size close to or less than wavelength of light is exposed to light, its oscillating electric field will cause the electron cloud of the metal micro/nanoparticle q to be displaced relative to the core, the electron cloud oscillates around the core due to the resilience resulting from the Coulomb force between the electron cloud and the core, and such collective oscillations of the electron cloud is called SP resonance, as illustrated in FIG. 1.

Figure 2:
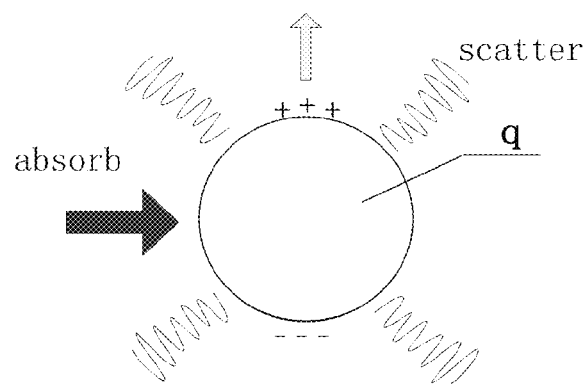
FIG. 2 is a schematic diagram illustrating light scattering and absorption by a metal micro/nanoparticle in Embodiment 1 of the present invention.

When a SP resonance occurs, electromagnetic field around the metal micro/nanoparticle q is greatly enhanced. At this point, the metal micro/nanoparticle q may be considered as a nano-lens, while an oscillating plasmon may be considered as a photon, which is strongly limited within a particle with a nano-size. A very important effect brought by the SP resonance is that light scattering and absorption section of the metal micro/nanoparticle q is greatly enlarged, as shown in FIG. 2.

Here, oscillating frequency mainly depends on electron density (determined by metal type), valid electron mass, as well as size, shape and surrounding dielectric of the metal micro/nanoparticle q.

Resonance frequency of the SP $\omega_{sp}$ may be obtained according to the following formula:

$$\omega_{sp} = \frac{\omega_p}{\sqrt{1 + 2\varepsilon_m}} \quad (1)$$

In formula (1), $\omega_p$ is the frequency of the SP, $\in_m$ is the dielectric constant of the surrounding dielectric.

Outer quantum efficiency ($\eta_{ext}$) of the OLED may be obtained according to the following formula:

$$\eta_{ext} = C'_{ext} \times \eta_{int} = C'_{ext} \times \frac{K_{rad}}{K_{rad} + K_{non}} \quad (2)$$

In formula (2), $C'_{ext}$ is light extraction efficiency, flint is inner quantum efficiency. The inner quantum efficiency ($\eta_{int}$) is determined by the ratio of radiation deactivation rate ($K_{rad}$) to non-radiation deactivation rate ($K_{non}$). In general, for an OLED, its radiation deactivation rate ($K_{rad}$) is larger than its non-radiation deactivation rate ($K_{non}$) under room temperature, which results in a medium inner quantum efficiency ($\eta_{int}$). With SPs, the inner quantum efficiency ($\eta_{int}$) and light extraction efficiency ($C'_{ext}$) may be improved, respectively. Here, improving the inner quantum efficiency ($\eta_{int}$) of the OLED by using SPs is based on the principle that spontaneous radiation deactivation rate ($K_{rad}$) of an exciton is related to its density of states, and specifically, when luminescence center is located in a microcavity at a wavelength scale, the photonic density of states increases, and this leads to an increased spontaneous radiation deactivation rate ($K_{rad}$) of the exciton, thus improving the ratio of radiation deactivation, i.e., improving the inner quantum efficiency ($\eta_{int}$). Improving the light extraction efficiency ($C'_{ext}$) of the OLED by using SPs is based on the principle that the light which has an angle of incidence greater than the total internal reflection angle and cannot radiates outward may excite SPs, which then may radiate outward in the form of light, thus improving the outer quantum efficiency ($\eta_{ext}$) of the OLED. It can be thus seen that, the outer quantum efficiency ($\eta_{ext}$) of the OLED may be effectively improved by using the SP resonance effect of the metal micro/nanoparticles in a rational way.

In summary, the transparent electrode layer (i.e., the first electrode layer 104) of the OLED of the array substrate provided by this embodiment is disposed above the planarization layer 103 doped with metal micro/nanoparticles q, such that the light exaction efficiency of the OLED is improved significantly, thus improving the light extraction efficiency of the array substrate.

Preferably, the material of the metal micro/nanoparticles q may be any one or any combination of gold, silver and aluminum. Of course, a composite structure of other metals may also be used. The metal micro/nanoparticles q may have any shape selected from sphere, prism, cube, cage, and core-shell structure, and have particle diameters between 1 nm and 100 nm. Preferably, the metal micro/nanoparticles q in the planarization layer 103 have particle diameters of various sizes, that is, the doped metal micro/nanoparticles q have different particle diameters. As such, the SPs of the metal micro/nanoparticles q that resonate may have energies corresponding to different wavelengths, and accordingly the light extraction efficiency of the OLED is improved more effectively.

Preferably, a mass concentration ratio of the metal micro/nanoparticles q to the planarization layer 103 is controlled to be within a range of no less than 1% and no larger than 5%, so as to ensure that the electrical properties of the planarization layer 103 will not be substantially affected. The metal micro/nanoparticles q doped in the planarization layer 103 may be doped uniformly or nonuniformly; the planarization layer 103 may be doped with metal micro/nanoparticles q having the same shape, such as sphere, prism, cube, cage, and core-shell structure, or be doped with metal micro/nanoparticles q having different shapes which include any two or more shapes of sphere, prism, cube, cage, and core-shell structure.

The first electrode layer 104 may serve as an anode layer, while the second electrode layer 107 serves as a cathode layer, and alternatively, the first electrode layer 104 serves as a cathode layer, while the second electrode layer 107 serves as an anode layer, as long as it is ensured that the planarization layer 103 doped with the metal micro/nanoparticles q is pervious to light. Preferably, if the first electrode layer 104 is the anode layer, the material thereof may be any one of indium tin oxide, zinc oxide and indium gallium zinc oxide, at this point, the second electrode layer 107 is a reflective layer (i.e., the cathode layer), and it may use a metal material selected from silver, copper and aluminum. In this case, the light incident on the second electrode layer 107 may be reflected to the first electrode layer 104 and then leaves the OLED after passing through the first electrode layer 104. If the first electrode layer 104 is the cathode layer, it may also use a metal material selected from silver, copper and aluminum, and its thickness should be configured to be very thin so as to guarantee that light may pass therethrough. At this point, a reflective layer, which may be made of a reflective material such as aluminum, silver, or the like, is provided on the light-exiting side of the second electrode layer 107 (i.e., the anode layer), In this case, the light incident on the second electrode layer 107 may be reflected to the first electrode layer 104 by the reflective layer provided at the light-exiting side of the second electrode layer 107, and leaves the OLED after passing through the first electrode layer 104.

Of course, a TFT 102 may also be included in the array substrate, and is covered by the planarization layer. Preferably, the drain of the TFT 102 is connected to the first electrode layer 104 of the OLED through a contact via passing through the planarization layer 103 disposed thereon. At this point, the OLED is driven to emit light by the TFT 102, such that the light emitted from the OLED is emitted outside after passing through the transparent substrate 101 (that is how a bottom emission OLED works).

Figure 4:
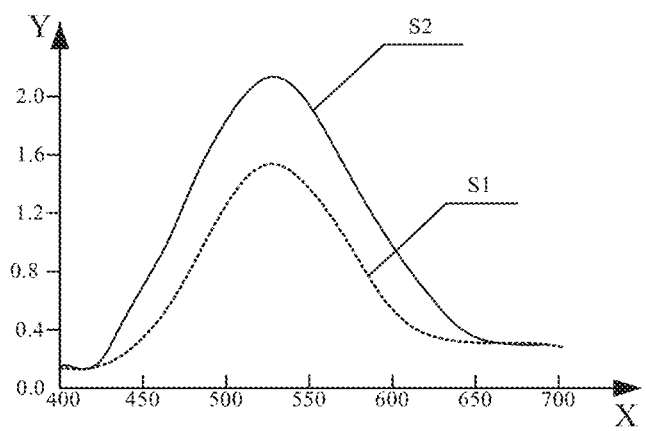
FIG. 4 is a schematic diagram illustrating a comparison between the light extraction efficiency of an OLED in an array substrate doped with metal micro-nanoparticles in Embodiment 1 of the present invention and the light extraction efficiency of an OLED in an existing array substrate.

FIG. 4 is a schematic diagram illustrating a comparison between the light extraction efficiency of an OLED in an array substrate doped with metal micro/nanoparticles q and the light extraction efficiency of an OLED in an existing array substrate. As shown in FIG. 4, X-axis shows wavelength, Y-axis shows light-emitting intensity, S1 is a light extraction efficiency curve of an OLED in a array substrate comprising an existing planarization layer, S2 is a light extraction efficiency curve of the OLED in the array substrate comprising the planarization layer 103 doped with the metal micro/nanoparticles q, and it is obvious that, compared to the prior art, the OLED in the array substrate comprising the planarization layer 103 doped with the metal micro/nanoparticles q has a higher light extraction efficiency.

Embodiment 2

This embodiment provides a display device, which comprises the array substrate described in Embodiment 1, and the display device may be any product or component with a display function, such as a mobile phone, a tablet computer, a television, a display, a notebook computer, a digital frame or a navigator.

The display device provided by this embodiment includes the array substrate in Embodiment 1, and thus has improved light extraction efficiency and better visual effect.

Of course, the display device of the embodiment may also include other conventional structures, such as power source unit, display drive unit, and the like. As these structures belong to the prior art, they are not elaborated herein.

Embodiment 3

This embodiment provides a manufacturing method of an array substrate, which comprises the steps as below.

Step 1: a TFT 102 is formed on a substrate 101 through a patterning process. Here, the TFT 102 may be a top-gate or bottom-gate TFT.

Obviously, signal lines such as gate lines or data lines may be formed at the same time. In addition, the TFT may be driven by an existing 2T1C circuit.

Step 2: a planarization layer 103 doped with metal micro/nanoparticles q is formed on the substrate 101 formed with the TFT 102, such that the planarization layer 103 covers the TFT 102 and extends onto the substrate 101.

Figure 5:
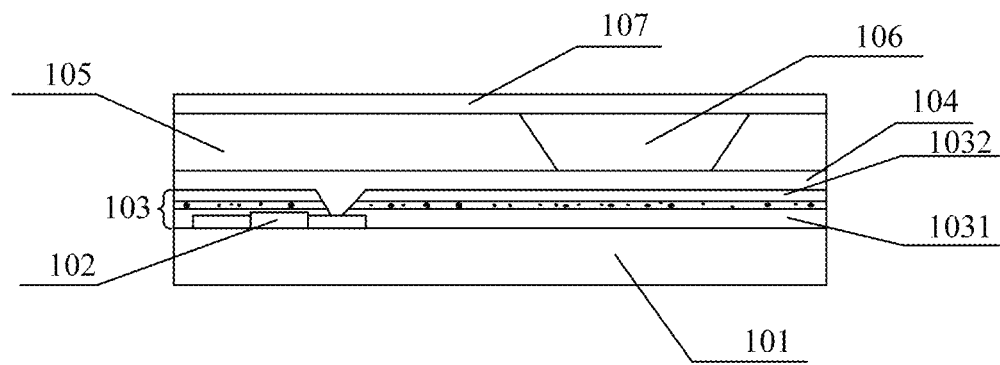
FIG. 5 is a schematic diagram illustrating a structure of a finished array substrate in Embodiment 3 of the present invention.

As described above, the material of the metal micro/nanoparticles q may be any metal or any alloy of gold, silver and aluminum. Of course, a composite structure of other metals may also be used. Thereinafter, by taking the case that the material of the metal micro/nanoparticles q is gold as an example, the specific method of forming the planarization layer 103 doped with metal (Au) micro/nanoparticles q will be described. Referring to FIG. 5, the method comprises the steps of:

S101: depositing a first planarization layer 1031 on the substrate 101 formed with the TFT 102;

S102: coating an Au layer with a thickness of 2 nm on the surface of the first planarization layer 1031 by sputtering, annealing the coated Au layer for half an hour at a temperature of 300° C. in a vacuum atmosphere having a vacuum degree of less than $1 \times 10^{-3}$ Pa, and then cooling it to room temperature, so as to form a non-continuous metal micro/nanoparticle q layer; and S103: depositing a second planarization layer 1032 on the non-continuous metal micro/nanoparticle q layer by electron beam evaporation process or vapor deposition process to cover the non-continuous metal micro/nanoparticle q layer, thus forming the planarization layer 103 with metal (Au) micro/nanoparticles q embedded therein (specifically, formed by the first planarization layer 1031, the second planarization layer 1032 and the metal micro/nanoparticle q layer).

Here, the sputtering method in the above manufacturing process may be replaced by another dry film-forming process, such as vacuum evaporation, chemical vapor deposition, or the like.

Alternatively, the planarization layer doped with the metal (Au) micro/nanoparticles q may be formed by using a method of sputtering. This method includes preparing a metal micro/nanoparticle q dispersed oxide, gold (Au)-silica ($SiO_2$) composite film, by using a Multi-target magnetron sputtering technique.

Specifically, in a dual target magnetron sputtering cavity, one target material is high purity silica, and another target material is high purity gold. Sputtering gas is high purity argon (with a purity of 99.995%). Before sputtering, the vacuum degree of the cavity is set to be less than $5 \times 10^{-5}$ Pa, the sputtering pressure is set to be $1.6 \times 10^{-1}$ Pa. During sputtering, the flow rates of argon and oxygen are set to be $8.3 \times 10^{-8}$ m$^3$/s and $5.8 \times 10^{-8}$ m$^3$/s, respectively, and the RF powers of silica and gold are set to be 200 W and 50 W, respectively. By opening the adjustable baffle plate before the sputtering target, a ratio of the materials deposited on the substrate 101 is selected, thus obtaining Au (i.e., metal micro/nanoparticle)-silica composite films with different doping ratios, so as to obtain the planarization layer 105 uniformly doped with metal micro/nanoparticles q.

In addition, as described above, the metal micro/nanoparticles q may have any shape selected from sphere, prism, cube, cage, and core-shell structure. Below, a specific method of forming a planarization layer 103 doped with the metal micro/nanoparticles q will be described by taking core-shell structure as an example.

Firstly, a specific method of forming a planarization layer 103 doped with Ag@$SiO_2$ particles of core-shell structure is described by taking Ag@$SiO_2$ of core-shell structure (i.e., silver (Ag) is the core, and silica ($SiO_2$) is the shell) as an example. The method comprises the steps as below.

S201: a colloidal solution of Ag@$SiO_2$ of core-shell structure is prepared, and the specific steps include:

firstly preparing dilute solutions of hydrazine hydrate and silver nitrate, respectively; weighing 72.89 mg cetyl trimethyl ammonium bromide (CTAB), dissolving the CTAB in 200 mL of deionized water, and simultaneously adding 2.5 mL of hydrazine hydrate at a concentration of 0.1M, stirring the mixture under room temperature using a magnetic stirrer, about two minutes later, adding 5 mL of silver nitrate at a concentration of 0.05M dropwise, such that the color of the mixture gradually turns into reddish brown from colorless transparent, and obtaining the nano silver colloids after 7-10 minutes of continuous reaction; then adding 50 mL of anhydrous ethanol and 2 mL aqueous ammonia at a mass concentration of 25%, about one minute later, adding 0.25 mL of TEOS dropwise, and stirring the mixture constantly for two hours, thus obtaining the colloidal solution of monodispersed nano Ag@$SiO_2$ of core-shell structure.

Step S202: a sol-gel method is used to prepare a planarization layer 103 doped with Au@$SiO_2$ particles of core-shell structure (i.e., metal micro/nanoparticles q), and it specifically includes:

dispersing the colloidal solution of Ag@$SiO_2$ prepared above in a mixed solution consisting of TEOS, anhydrous ethanol, dilute hydrochloric acid so as to form a silica collosol; and then preparing the planarization layer 103 by using a method of spin-coating, thus obtaining the silica film embedded with Ag@$SiO_2$ particles (that is, the planarization layer 103 doped with Au@$SiO_2$ particles (i.e., metal micro/nanoparticles q) of core-shell structure) after desiccation.

In addition, the specific method of forming a planarization layer 103 doped with Au@polystyrene particles of core-shell structure is described by taking Au@ polystyrene of core-shell structure as an example. The method comprises the steps as below.

S301: Au@polystyrene particles of core-shell structure are prepared, and the specific steps include:

adding 1.0 g nano gold powder and 1.0 g polyvinyl pyrrolidone into 80 mL of water, then dispersing the mixture constantly using a ultrasound generator for half an hour (the power of the ultrasound generator is 500 W), then adding 1.0 g emulsifier, and dispersing the mixture constantly using the ultrasound generator for half an hour to obtain a homogeneous disperse system; then, transferring the obtained homogeneous disperse system into a four-neck flask equipped with electric stirrer, graham condenser, and N2 inlet pipe; placing the foregoing device in a thermostatic water tank, keep stirring the homogeneous disperse system for ten minutes, and then cooling it to 30° C. to prevent potassium peroxydisulfate from being decomposed too early after being added due to too high temperature; adding potassium peroxydisulfate (KPS) as an initiator, stirring the mixture constantly for 20 minutes while introducing N2 and expelling O2; then, adding purified styrene monomer held in a dropping funnel to the reaction system dropwise, which is finished after approximately ten minutes; then heating the mixture up to 70 V while keeping the stirring rate and the rate of introducing N2 constant; completing the reaction after five hours and then naturally cooling the mixture to below 40° C. while stirring so as to discharge, thus obtaining composite emulsion; demulsifying a certain amount of composite emulsion by using sodium chloride (NaCl), and finally obtaining Au@polystyrene particles of core-shell structure (i.e., Au nanoparticle is the core, and polystyrene is the shell) after filtering, washing and drying.

S302: a planarization layer 103 doped with Au@polystyrene particles of core-shell structure are formed, and it specifically includes:

dispersing the Au@polystyrene particles of core-shell structure prepared above in an organic solvent, mixing the mixture with a photoresist (such as a polyimide solution) which is ready for forming a planarization layer 103, and obtaining a photoresist film, which becomes the planarization layer 103 doped with Au@polystyrene particles of core-shell structure after desiccation, by using a process such as spin-coating.

It should be noted that although the method of forming the planarization layer 103 doped with metal micro/nanoparticles q has been described above only by taking the metal micro/nanoparticles q with a material of gold or silver, and/or a shape of core-shell structure as an example, however, the person skilled in the art may also form a planarization layers 103 doped with metal micro/nanoparticles q having other materials and/or other shapes without departing from the above teaching, which is not elaborated herein.

Step 3: on the planarization layer 103 doped with metal micro/nanoparticles q manufactured by using the above method, a first electrode layer 104, a pixel-defining layer 105, a light-emitting layer 106 and a second electrode layer 107 of an OLED are sequentially formed through a patterning process. Finally the array substrate as shown in FIG. 5 is formed, wherein the first electrode layer 104 is a transparent electrode layer. As the methods of forming the first electrode layer 104, the pixel-defining layer 105, the light-emitting layer 106 or the second electrode layer 107 are known, and therefore are not elaborated herein.

The planarization layer 103 of the array substrate prepared by using the above method is doped with metal micro/nanoparticles q, which may effectively improve the light extraction efficiency of the OLED, thus improving the light extraction efficiency of the array substrate.

It should be understood that, the above implementations are only exemplary implementations for explaining the principle of the present invention; however, the present invention is not limited thereto. For person skilled in the art, various variations and improvements may be made without departing from the spirit and essence of the present invention, and these variations and improvements are also considered within the protection scope of the present invention.

What is claimed is:

1. An array substrate, comprising an organic electroluminescence device and a planarization layer disposed there below, the organic electroluminescence device comprising: a first electrode layer, a second electrode layer, and a light-emitting layer disposed between the first electrode layer and the second electrode layer, wherein the first electrode layer is a transparent electrode layer, both the first electrode layer and the second electrode layer are disposed above the planarization layer, the planarization layer is doped with metal micro/nanoparticles to improve light extraction efficiency, wherein the planarization layer includes a first planarization layer on a metal micro/nanoparticle layer including the metal micro/nanoparticles on a second planarization layer, wherein the metal micro/nanoparticles are only contained in the metal micro/nanoparticle layer, and wherein a mass concentration of the metal micro/nanoparticles in the entire planarization layer is no less than 1% and no larger than 5%.

2. The array substrate of claim 1, wherein a material of the metal micro/nanoparticles is any one or any combination of gold, silver and aluminum.

3. The array substrate of claim 1, wherein the metal micro/nanoparticles have a shape of any one of sphere, prism, cube, cage, and core-shell structure.

4. The array substrate of claim 1, wherein the metal micro/nanoparticles have particle diameters between 1 nm and 100 nm.

5. The array substrate of claim 1, wherein the metal micro/nanoparticles have particle diameters of various sizes.

6. The array substrate of claim 1, wherein a material of the first electrode layer is any one of indium tin oxide, zinc oxide and indium gallium zinc oxide, and/or, a material of the second electrode layer is any one of silver, copper and aluminum.

7. The array substrate of claim 6, further comprising a TFT, which is covered by the planarization layer, wherein a drain of the TFT is connected to the first electrode layer of the organic electroluminescence device through a contact via passing through the planarization layer.

* * * * *